US011056514B2

(12) United States Patent
Ishii et al.

(10) Patent No.: US 11,056,514 B2
(45) Date of Patent: Jul. 6, 2021

(54) MANUFACTURING METHOD FOR DISPLAY DEVICE

(71) Applicant: Japan Display Inc., Tokyo (JP)

(72) Inventors: Yoshinori Ishii, Tokyo (JP); Kazufumi Watabe, Tokyo (JP); Hidekazu Miyake, Tokyo (JP)

(73) Assignee: Japan Display Inc., Tokyo (JP)

( * ) Notice: Subject to any disclaimer, the term of this patent is extended or adjusted under 35 U.S.C. 154(b) by 201 days.

(21) Appl. No.: 15/659,796

(22) Filed: Jul. 26, 2017

(65) Prior Publication Data
US 2018/0040644 A1 Feb. 8, 2018

(30) Foreign Application Priority Data
Aug. 2, 2016 (JP) .............................. JP2016-152066

(51) Int. Cl.
*H01L 27/12* (2006.01)
*G02F 1/13* (2006.01)
(Continued)

(52) U.S. Cl.
CPC ........ *H01L 27/1248* (2013.01); *G02F 1/1303* (2013.01); *G02F 1/1368* (2013.01); *G02F 1/133345* (2013.01); *G02F 1/136227* (2013.01); *H01L 27/1244* (2013.01); *H01L 27/1259* (2013.01); *H01L 27/1262* (2013.01);
(Continued)

(58) Field of Classification Search
CPC ... H01L 51/56; H01L 27/262; H01L 27/3248; H01L 27/3258; H01L 27/3262; H01L 51/5218; H01L 27/1248; H01L 27/1259; H01L 27/1244; H01L 27/1262; H01L 27/124; H01L 27/3276; H01L 2227/323; H01L 2251/556; H01L 2251/558; G02F 1/1303; G02F 1/133345; G02F 1/136227; G02F 1/1368; G02F 1/1362; G02F 1/13439; G02F 2201/501; G02F 2201/121; G02F 2201/123; G02F 2202/022

See application file for complete search history.

(56) References Cited

U.S. PATENT DOCUMENTS 5,049,421 A * 9/1991 Kosh ................. A47G 19/2255
116/268
5,173,392 A * 12/1992 Miersch ............. H01L 21/4846
216/19
(Continued)

FOREIGN PATENT DOCUMENTS

JP 2004-317649 A 11/2004

*Primary Examiner* — Dale E Page
*Assistant Examiner* — Quovaunda Jefferson
(74) *Attorney, Agent, or Firm* — Michael Best & Friedrich LLP

(57) ABSTRACT

Separation of wirings formed on an organic passivation film is prevented in an organic EL display device or a liquid crystal display device. The organic EL display device includes a TFT formed on a substrate and an organic passivation film formed to cover the TFT. An intermediate film containing SiO or SiN is formed to cover the organic passivation film. An insulation film formed with an organic material is formed on the intermediate film. A reflective electrode is formed on the intermediate film. The reflective electrode is connected to the TFT via a through-hole formed in the organic passivation film and a through-hole formed in the intermediate film.

3 Claims, 10 Drawing Sheets

(51) Int. Cl.
  *G02F 1/1333* (2006.01)
  *G02F 1/1362* (2006.01)
  *G02F 1/1368* (2006.01)
  *H01L 27/32* (2006.01)
  *H01L 51/52* (2006.01)
  *H01L 51/56* (2006.01)
  *G02F 1/1343* (2006.01)

(52) U.S. Cl.
  CPC ...... H01L 27/3248 (2013.01); H01L 27/3258 (2013.01); H01L 27/3262 (2013.01); H01L 51/5218 (2013.01); H01L 51/56 (2013.01); *G02F 1/1362* (2013.01); *G02F 1/13439* (2013.01); *G02F 2201/121* (2013.01); *G02F 2201/123* (2013.01); *G02F 2201/501* (2013.01); *G02F 2202/022* (2013.01); *H01L 27/124* (2013.01); *H01L 27/3276* (2013.01); *H01L 2227/323* (2013.01); *H01L 2251/556* (2013.01); *H01L 2251/558* (2013.01)

(56) References Cited

U.S. PATENT DOCUMENTS

| | | | |
|---|---|---|---|
| 5,849,607 A * | 12/1998 | Seo | H01L 24/80 |
| | | | 438/114 |
| 2008/0154005 A1 * | 6/2008 | Suzuki | C07C 211/54 |
| | | | 526/310 |
| 2010/0276695 A1 * | 11/2010 | Yamazaki | H01L 23/53238 |
| | | | 257/72 |
| 2015/0035058 A1 * | 2/2015 | Takayama | B32B 17/04 |
| | | | 257/347 |
| 2015/0126045 A1 * | 5/2015 | Chatterjee | H01L 21/0217 |
| | | | 438/793 |
| 2017/0077194 A1 * | 3/2017 | Liu | H01L 51/56 |

* cited by examiner

MANUFACTURING METHOD FOR DISPLAY DEVICE

CLAIM OF PRIORITY

The present application claims priority from Japanese Patent Application JP 2016-152066 filed on Aug. 2, 2016, the content of which is hereby incorporated by reference into this application.

BACKGROUND OF THE INVENTION

1. Field of the Invention

The present invention relates to a display device, and particularly relates to a configuration for preventing gas generated from an organic insulation film from causing separation of a film on the organic insulation film.

2. Description of the Related Art

An organic passivation film is used in an organic electroluminescence (EL) display device or a liquid crystal display device for planarizing a pixel part. In the organic EL display device, a metal wiring and a reflective electrode are formed on the organic passivation film. In the liquid crystal display device, a common electrode formed with indium tin oxide (ITO) into a planar shape on the organic passivation film and an insulation film covering this common electrode and formed with SiN or the like are present.

In the organic EL display device, a conductive film, an insulation film, an anode, an organic EL film, a cathode, a protective film, and the like are formed as many layers. In the liquid crystal display device, a conductive film, an insulation film, a common electrode, an interlayer insulation film, a pixel electrode, and the like are formed as many layers. It is necessary to address the problem of an adhesive force between these films in the display device.

JP-A-2004-317649 discloses a configuration such that when an ITO film that is a transparent conductive film is formed on an organic film, six layers of thin films formed with $SiO_2$, $Cr_2O_3$ or the like are formed between the organic film and the ITO film to prevent a phenomenon such as breaking of the ITO film or separation of the ITO film from the organic film due to a stress on the ITO film, thereby relaxing the stress generated in the ITO film.

SUMMARY OF THE INVENTION

An organic insulation film (hereinafter, referred to as "organic passivation film") normally contains moisture and the like. Polyimide is an important material particularly for a flexible display because of high heat resistance, high mechanical strength, and the like. On the other hand, the polyimide has a property of being quite prone to contain moisture.

If the organic passivation film contains the moisture and the like, then gas is released from the organic passivation film in baking or the like carried out in a later process, and a phenomenon occurs that the metal film, the insulation film or the like formed on the organic passivation film is separated. This causes a conduction failure, an insulation failure or the like. It is noted that the configuration disclosed in JP-A-2004-317649 is not intended to take measures against the separation of the film due to gas from the organic film.

An object of the present invention is to prevent a phenomenon of separation of a metal wiring or an inorganic insulation film formed on a passivation film in baking or the like carried out in a later process if an organic material such as polyimide prone to contain moisture and gas is used for the passivation film.

To achieve the above object, aspects of the present invention provide the following.

(1) An organic EL display device includes a TFT formed on a substrate; and an organic passivation film formed to cover the TFT, in which an intermediate film containing SiO or SiN is formed to cover the organic passivation film, an insulation film formed with an organic material is formed on the intermediate film, a reflective electrode is formed on the intermediate film, and the reflective electrode is connected to the TFT via a through-hole formed in the organic passivation film and a through-hole formed in the intermediate film.

(2) A method of manufacturing an organic EL display device including a TFT formed on a substrate and an organic passivation film formed to cover the TFT, the method including: annealing the organic passivation film at 250° C. to 300° C. for one hour or longer after forming the organic passivation film; heating the organic passivation film in a CVD device after the annealing; and depositing an intermediate film formed with SiO or SiN to cover the organic passivation film in an environment at 200° C. to 300° C. by CVD after the heating.

(3) A method of manufacturing a liquid crystal display device including a TFT formed on a substrate and an organic passivation film formed to cover the TFT, the method including: forming an intermediate film containing SiO or SiN so as to cover the organic passivation film; annealing the organic passivation film at 250° C. to 300° C. for one hour or longer after forming the organic passivation film; heating the organic passivation film in a CVD device after the annealing; and depositing an intermediate film formed with SiO or SiN to cover the organic passivation film in an environment at 200° C. to 300° C. by CVD after the heating.

DESCRIPTION OF THE PREFERRED EMBODIMENTS

Embodiments of the present invention will be described hereinafter in detail while using embodiments.

First Embodiment

Figure 1:
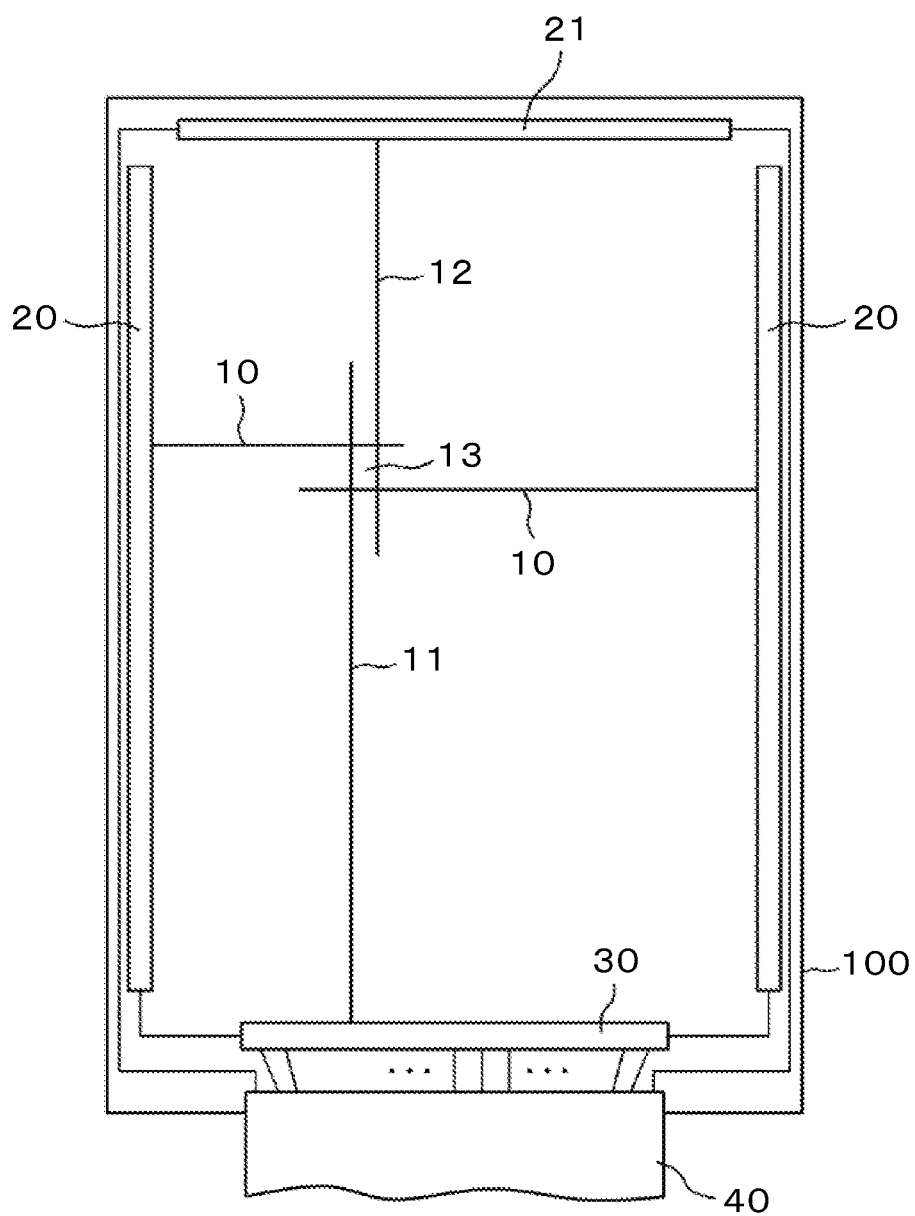
FIG. 1 is a plan view of an organic EL display device according to a first embodiment.

FIG. 1 is a plan view of an organic EL display device to which the present invention is applied. In FIG. 1, scan line drive circuits 20, a power supply line bus 21, and a driver IC 30 that drives video signal lines are disposed on a peripheral part of a TFT substrate 100, and a display region is defined inside of these constituent elements. The scan line drive circuits 20 are formed on two sides of the display region, and scan lines 10 extend alternately from the scan line drive circuits 20 on the two sides through the display region in a lateral direction. Power supply lines 12 extend from above, i.e., from the power supply line bus 21 on an upper side of the display region in a longitudinal direction, while video signal lines 11 extend from the driver IC 30, which includes a video signal line drive circuit, on a lower side of the display region in the longitudinal direction. A region surrounded by the two scan lines 10, one video signal line 11, and one power supply line 12 serves as a pixel 13. A flexible wiring board 40 is connected to the driver IC 30 outside thereof. A video signal, a power supply signal, a clock signal, and the like are supplied from the flexible wiring board 40.

Figure 2:
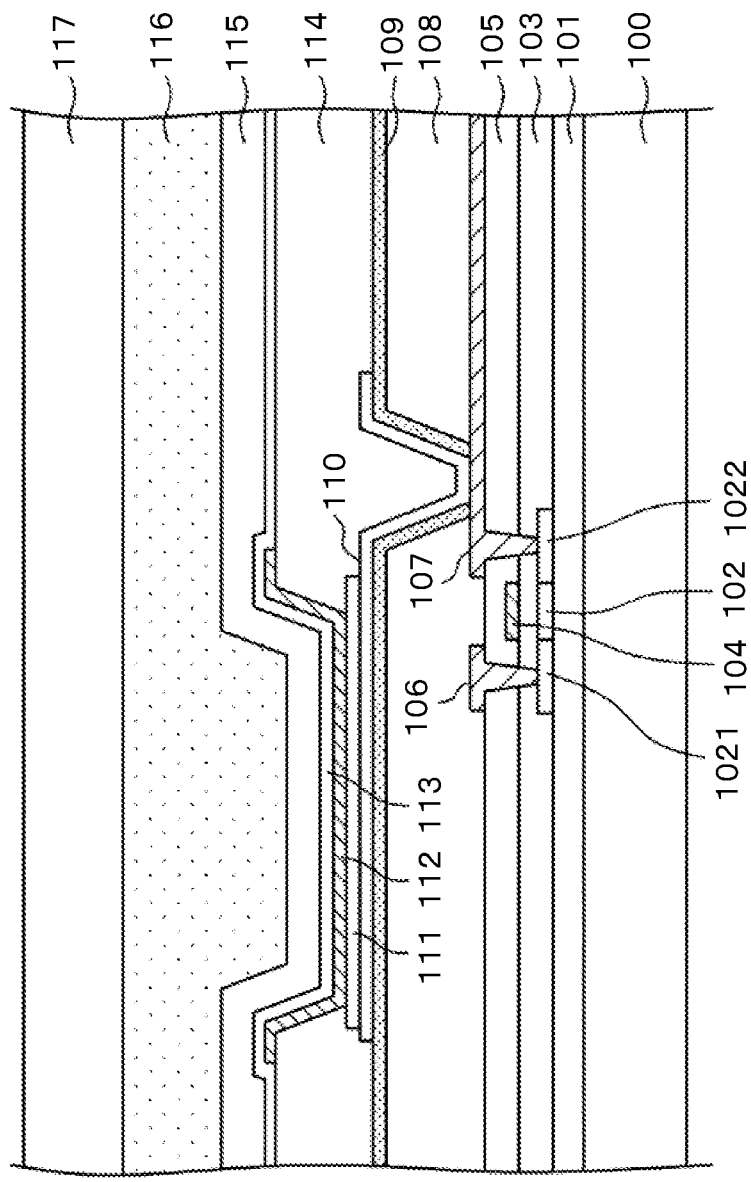
FIG. 2 is a cross-sectional view of a pixel part of the organic EL display device according to the first embodiment.

FIG. 2 is a cross-sectional view of the display region of the organic EL display device according to the present invention. In FIG. 2, a base film 101 is formed on the TFT substrate 100 formed with glass. The base film 101 is formed with a stacked film composed of an SiO film, an SiN film, and the like and intended to prevent impurities from the glass from contaminating semiconductor layers. If the organic EL display device is used as a flexible display, the TFT substrate 100 is formed with a resin such as polyimide. In this case, similarly to the above, the base film 101 is necessary and a stacked film composed of an AlO film or the like that exhibits a high blocking property against moisture as well as the SiO film and the SiN film is sometimes used for the base film 101.

It is noted that an expression such as AB (e.g., SiO) in the present specification indicates a compound constituted by elements A and B and does not signify that A and B are equal in composition ratio. While basic composition ratios of the elements are known, there are normally many cases where composition ratios of the elements differ from these basic composition ratios depending on manufacturing conditions or the like.

A semiconductor layer 102 that constitutes each thin film transistor (TFT) is formed on the base film 101. The semiconductor layer 102 is obtained by initially forming amorphous silicon (a-Si) by chemical vapor deposition (CVD) and then converting the a-Si into polycrystalline silicon (Poly-Si) by an excimer laser. A gate insulation film 103 is formed with SiO made from tetraethyl orthosilicate (TEOS) to cover the semiconductor layer 102, and a gate electrode 104 are formed on the gate insulation film 103. Subsequently, ions of phosphorus, boron or the like are implanted into portions of the semiconductor layer 102 that are not covered with the gate electrode 104 to impart conductivity to the portions thereof, thereby forming a drain 1021 and a source 1022.

An interlayer insulation film 105 is formed with SiN or the like to cover the gate electrode 104. Through-holes are formed in the interlayer insulation film 105 and the gate insulation film 103 to connect a drain electrode 106 to a source electrode 107. An organic passivation film 108 is formed to cover the drain electrode 106 and the source electrode 107. An appropriate material of the organic passivation film 108 is polyimide. The polyimide has excellent heat resistance and excellent mechanical strength. The polyimide constituting the organic passivation film 108 is formed with a photosensitive resin. An exposed portion of the photosensitive resin is dissolved in a developing solution, so that through-holes and the like can be formed without using a resist.

The polyimide is prone to contain gas and, most notably, moisture. According to the present invention, the polyimide is patterned, cured, and then baked at a high temperature, thereby releasing the moisture and the gas from the polyimide. An SiN film or SiO film serving as an intermediate film 109 and having a thickness of about 50 to 200 nm is formed to cover the polyimide to prevent the polyimide from absorbing moisture and gas again. The processes will be described later.

Subsequently, a reflective electrode 110 is formed on the intermediate film 109. The reflective electrode 110 is connected to the source electrode 107 via through-hole formed in the organic passivation film 108 and a through-hole formed in the intermediate film 109. While the reflective electrode 110 is formed with an Al alloy, the Al alloy is sandwiched between high melting point metals or high melting point alloys such as Ti or MoW in order to prevent hillocks or stabilize electrical contact with other metals.

In FIG. 2, an anode 111 is formed with ITO or the like on the reflective electrode 110. A bank 114 is then formed with an organic material such as polyimide or an acrylic resin. The bank 114 serves to, for example, prevent generation of disconnections in an organic EL layer 112 to be formed later or to define a pixel interval. The organic EL layer 112 is formed in a through-hole formed in the bank 114. The organic EL layer 112 is formed from a plurality of layers such as a hole injection layer, a hole transport layer, a light-emitting layer, an electron transport layer, and an electron injection layer.

Subsequently, a cathode 113 is formed with any of ITO, indium zinc oxide (IZO), antimony zinc oxide (AZO) films that are transparent conductive films. The cathode 113 is formed commonly on an entire surface of the display region. A protective film 115 is formed with SiN or the like by the CVD or the like to cover the cathode 113. A polarizing plate 117 is adhesively bonded on the protective film 115 via an adhesive 116. The polarizing plate 117 is intended to prevent reflection of outside light to improve visibility of an image.

Meanwhile, there are cases where, as a method of manufacturing the organic EL display device, an array manufacturer forms the constituent elements up to, for example, the reflective electrode 110 or the anode 111 shown in FIG. 2, and an organic EL display device manufacturer forms the remaining constituent elements in subsequent processes. This possibly causes a case where the organic EL display device is left uncontrolled in the atmosphere for long time halfway along the processes after formation of the reflective electrode 110 or the anode 111.

The reflective electrode 110, the anode 111, and the like shown in FIG. 2 do not cover an entire surface of the organic passivation film 108 formed with the polyimide or the like, so that the organic passivation film 108 is exposed to the atmosphere. Accordingly, the organic passivation film 108 absorbs moisture and the like in large quantities contained in the atmosphere.

The organic EL display device manufacturer carries out baking at a temperature higher than 200° C., for example, 270° C. for about one hour in order to release the moisture and the gas from the organic passivation film 108 and the like before formation of the bank 114. At this time, releasing the moisture and the gas absorbed by the organic passivation film 108 causes separation of the films formed on the organic passivation film 108. Alternatively, if the baking insufficiently releases the gas or the like, the gas is released while the organic EL display device is operating, resulting in film separation. Such separation is serious particularly in a stacked part of the bank 114 formed with the organic film similar to that of the organic passivation film 108.

Figure 3:
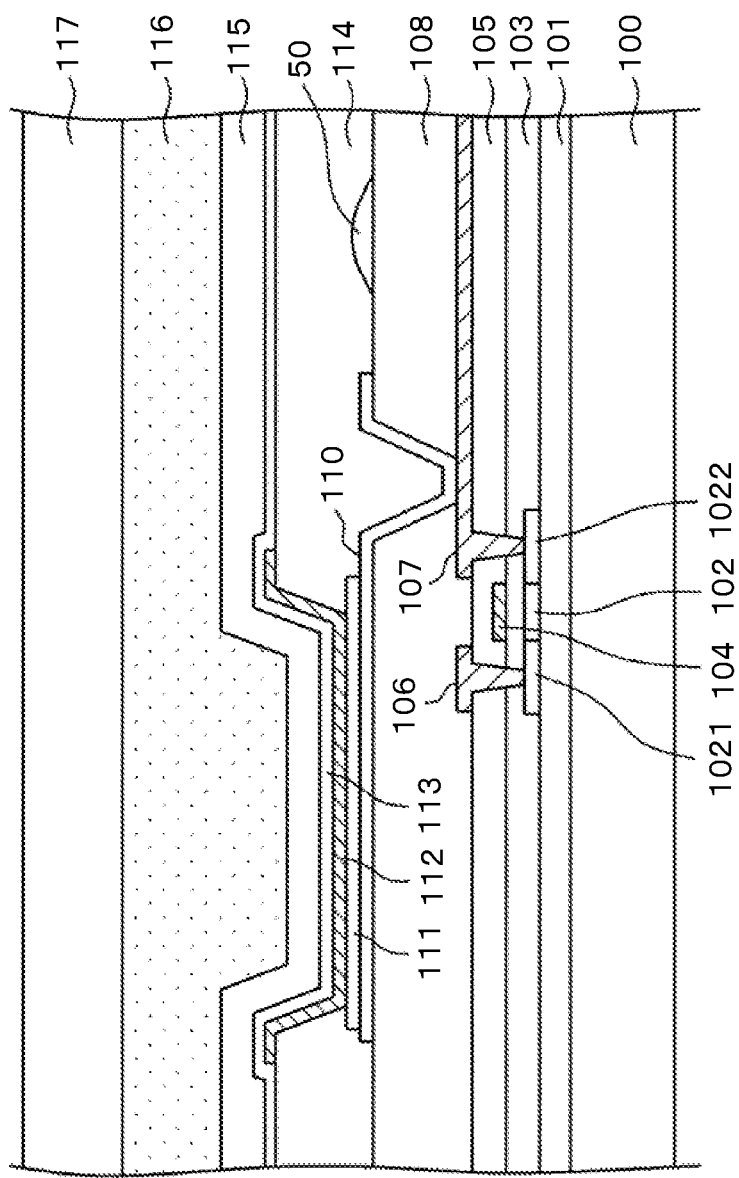
FIG. 3 is a cross-sectional view of an organic EL display device for illustrating problems in a case where the present invention is not applied.

FIG. 3 is a cross-sectional view of the organic EL display device in a case where the present invention is not applied. In FIG. 3, the intermediate film 109 to cover the organic passivation film 108 is not present and the bank 114 and the like are directly formed on the organic passivation film 108. If the organic passivation film 108 and the like are formed and then left uncontrolled, the organic passivation film 108 absorbs moisture.

Meanwhile, when the bank 114 is formed, the bank 114 is cured at a high temperature after patterning. At this time, if the organic passivation film 108 contains moisture, then this moisture is released in the form of gas, air bubbles 50 are generated on an interface between the organic passivation film 108 and the bank 114, and a phenomenon occurs that the bank 114 is separated from the organic passivation film 108.

In other words, since the organic material is prone to contain moisture and the moisture is released from both the organic materials that come in contact with each other, the air bubbles tend to be generated on the interface. Furthermore, the polyimide releases more moisture than that released by other organic materials, so that the risk of the generation of the air bubbles is higher in a portion where the polyimide film comes in contact with another polyimide film. Nevertheless, there is often inevitable configuration in which the polyimide films come in contact with each other since the polyimide has the excellent heat resistance and the excellent mechanical strength.

According to the present invention, by contrast, the organic passivation film 108 is baked for long time to sufficiently release the moisture and the like from the organic passivation film 108, and the organic passivation film 108 is then covered with the intermediate film 109 to prevent the organic passivation film 108 from absorbing moisture or the like from the atmosphere again. It is, therefore, possible to prevent the separation of the bank 114 and the generation of the air bubbles 50 as shown in FIG. 3.

Figure 4:
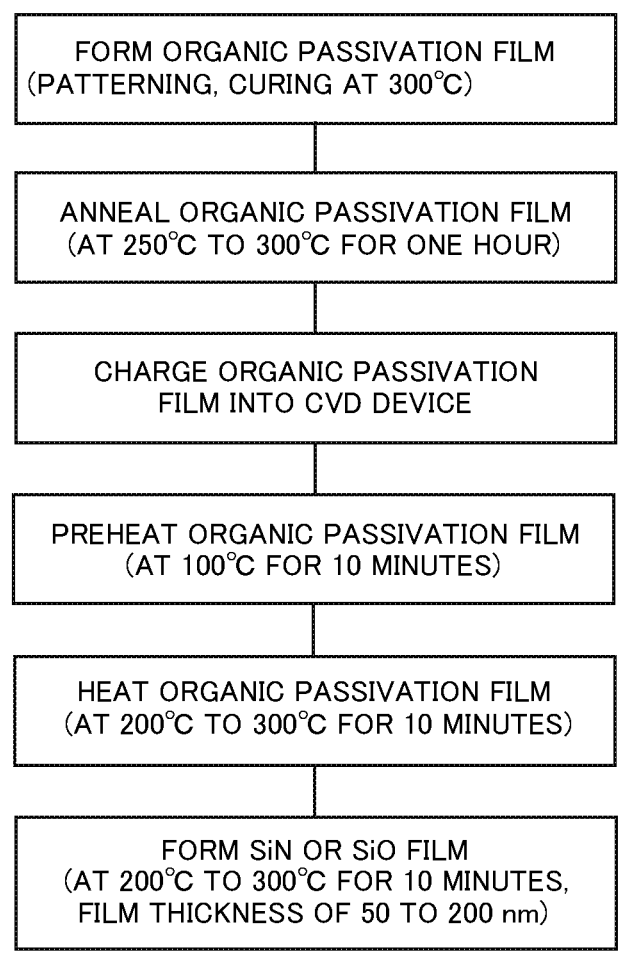
FIG. 4 is a flowchart illustrating processes according to the present invention.

FIG. 4 is a flowchart illustrating manufacturing processes of the organic passivation film and the intermediate film covering the organic passivation film according to the present invention. In FIG. 4, a polyimide material is coated to cover each TFT, dried, and preliminarily cured, thereby patterning the polyimide. The polyimide is then cured at about 300° C.

The following processes are characteristic of the present invention. The cured polyimide film is further annealed at 250° C. to 300° C. for about one hour, thereby releasing the moisture and gas from the polyimide. Preferably, annealing time is equal to or longer than one hour in order to ensure the sufficient release of the moisture and the gas. However, even if the gas is released from the polyimide film, the polyimide film absorbs moisture again when being left uncontrolled in the atmosphere.

The present invention prevents the polyimide from absorbing the moisture contained in the atmosphere again by covering the polyimide film with SiO or SiN. To this end, the polyimide film completed with annealing is charged into a CVD device. In a charging chamber, the polyimide film is first preheated at 100° C. for about ten minutes. In a heating chamber, the polyimide film is then heated at 200° C. to 300° C. for about ten minutes. In a film formation chamber, the polyimide film is subjected to the CVD at about 200° C. to 300° C. for about ten minutes, thereby forming the SiO or SiN at a thickness of about 50 to 200 nm.

Figure 5:
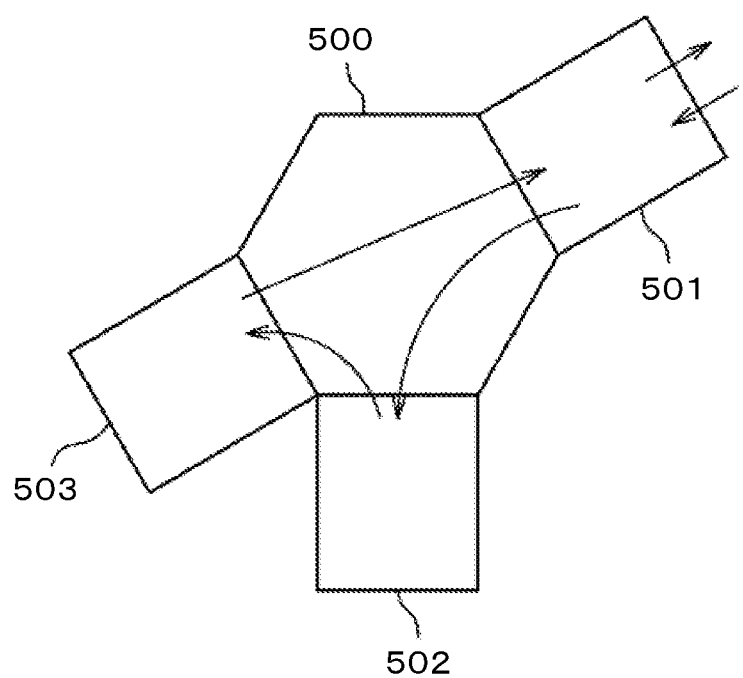
FIG. 5 is a schematic diagram of a CVD device according to the present invention.

FIG. 5 is a schematic diagram of a CVD device 500. In FIG. 5, arrows indicate moving directions of the TFT substrate 100. In FIG. 5, the TFT substrate 100 completed with the annealing of the organic passivation film 108 (for example, polyimide film) is charged into the CVD device 500 from an entry/exit chamber 501. In the entry/exit chamber 501, the TFT substrate 100 is preheated at 100° C. for about ten minutes.

The TFT substrate 100 completed with preheating is transported into a heating chamber 502. In the heating chamber 502, the TFT substrate 100 is heated 200° C. to 300° C. for about ten minutes to release the moisture and the like absorbed by the organic passivation film 108 after the annealing. Subsequently, the TFT substrate 100 is transported into a film formation chamber 503, where the SiO or SiN film at a thickness of about 50 to 200 nm is formed by the CVD. The CVD is carried out in an environment at 200° C. to 300° C. and deposition time is about ten minutes.

While it has been described so far that each of the preheating time in the entry/exit chamber 501, the heating time in the heating chamber 502, and the deposition time by the CVD in the film formation chamber 503 is ten minutes, the time is preferably equal to or longer than ten minutes since more moisture and gas can be released. The time is set to ten minutes because of tact time for proceeding with the processes at uniform timing. If the processes are made different in the timing such as the heating time, the number of accumulated substrates in each process may be changed. In other words, in the process in which the number of accumulated substrates is large, each substrate can remain in the process for longer time.

The TFT substrate 100 is then delivered into the atmosphere from the entry/exit chamber 501. At this time, the organic passivation film 108 is already covered with the intermediate film 109 formed with SiO or SiN. It is, therefore, possible to suppress the phenomenon that the organic passivation film 108 absorbs the moisture from within the atmosphere again. Furthermore, until the intermediate film 109 is formed with SiO or SiN after the TFT substrate 100 is charged into the CVD device 500, the processes are all carried out in the CVD device 500 that is a vacuum chamber. Therefore, there is no possibility that the organic passivation film 108 absorbs the moisture and the like from within the atmosphere.

Alternatively, in the subsequent process, AlO exhibiting a high barrier property against moisture may be formed by sputtering. In another alternative, a chamber for forming the AlO may be provided within the CVD device 500 that is the vacuum device for forming the SiO or SiN described above so that the AlO can be continuously formed in vacuum.

Therefore, even if the organic passivation film 108 is baked at the high temperature for forming the bank 114 in the subsequent process, it is possible to avoid the phenomenon that the moisture and the gas are released from the organic passivation film 108 to cause the separation of the intermediate film 109.

Figure 6:
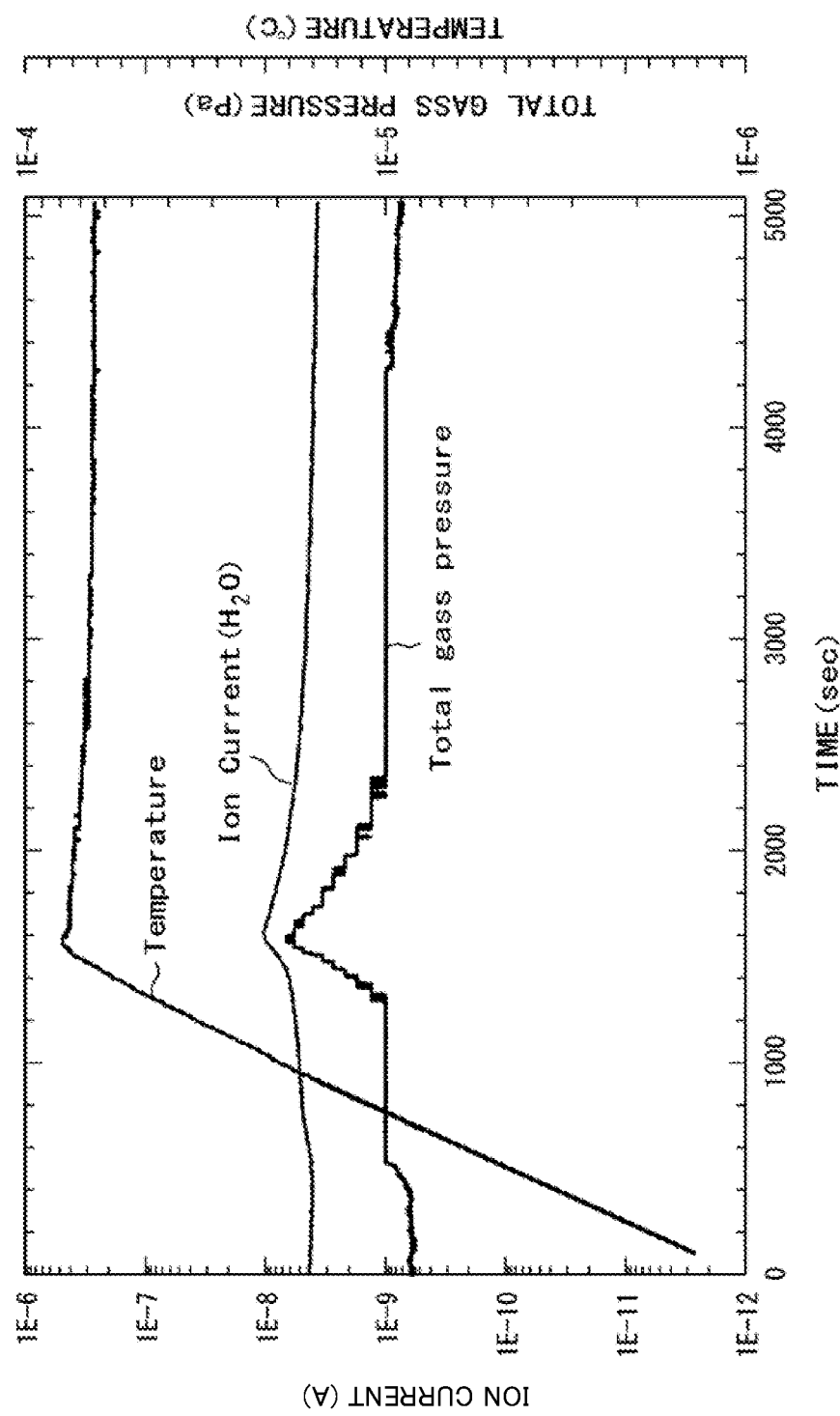
FIG. 6 is a graph illustrating measurement results of occluded gas in an organic passivation film in a case where the present invention is not applied.
Figure 7:
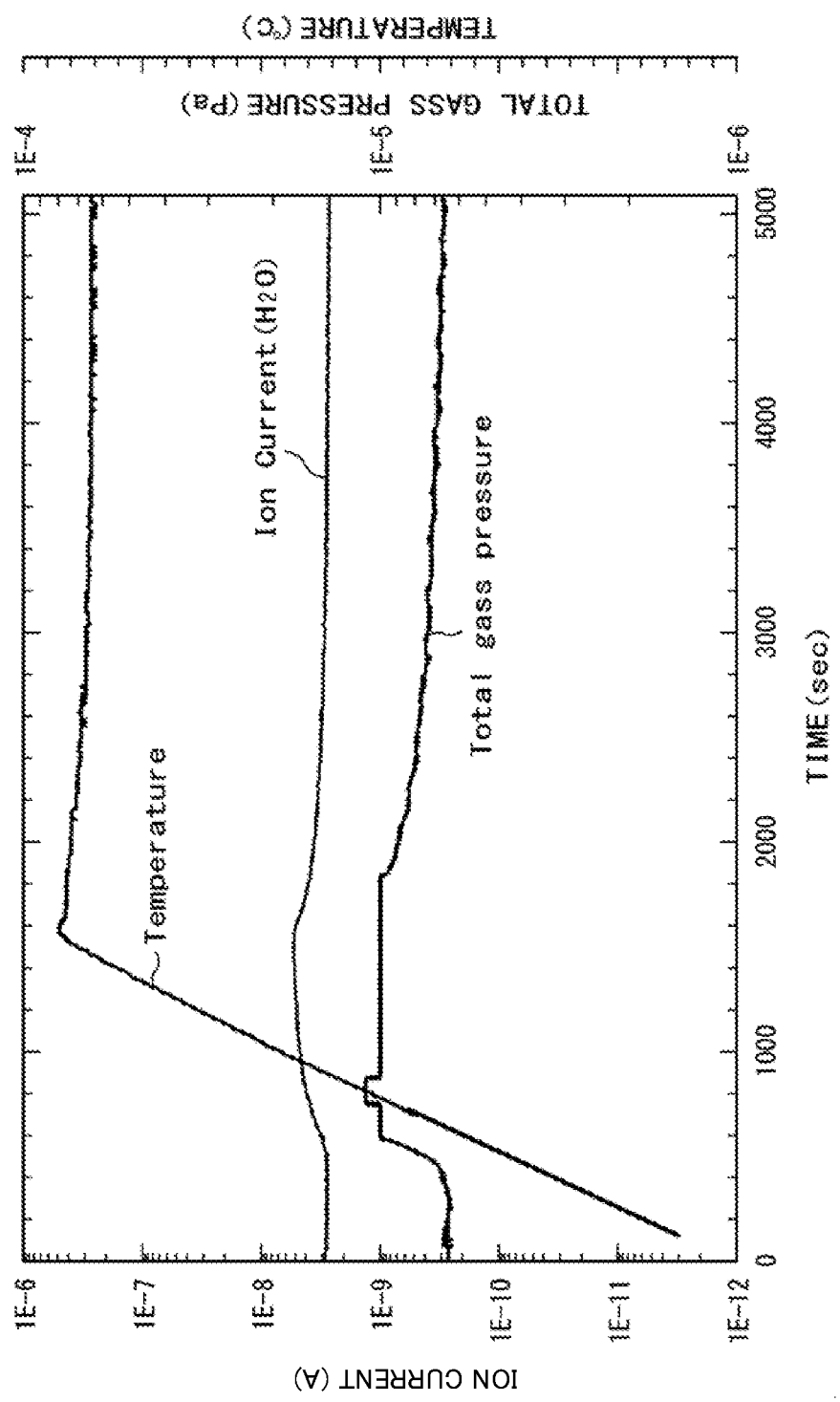
FIG. 7 is a graph illustrating measurement results of occluded gas in an organic passivation film according to the present invention.

FIGS. 6 and 7 illustrate measurement results of quantities of the released moisture and the gas from the organic passivation film 108 in a case where the present invention is not applied and in a case where the present invention is applied. FIG. 6 illustrates a state of the release of the moisture and the gas from the organic passivation film 108 in the case where the present invention is not applied. In FIG. 6, a horizontal axis represents time (in seconds). A vertical axis represents a substrate temperature (° C.), a total gas quantity (Pa), and a water quantity (an ion current (A)).

In FIG. 6, the substrate temperature is increased from a room temperature up to 270° C. by taking 24 minutes. The total gas quantity then rapidly increases at around 270° C. In FIG. 6, the moisture is measured by measuring a corresponding ion current. The quantity of the released moisture similarly, rapidly increases at around 270° C. In other words, in the case where the present invention is not applied, it is indicated that the gas and moisture in large quantities are contained in the organic passivation film 108.

FIG. 7 illustrates a quantity of the moisture and a total quantity of the gas released from the organic passivation film 108 according to the present invention. In FIG. 7, a horizontal axis represents time (in seconds). A vertical axis represents a substrate temperature (° C.), a total gas quantity (Pa), and a water quantity (an ion current (A)). Measurement conditions are the same as those in the case of FIG. 6. In other words, the substrate temperature is increased from the room temperature up to 270° C. by taking 24 minutes.

In FIG. 7, the total gas quantity increases as the temperature increases; however, the increase is not so large differently from that shown in FIG. 6. Furthermore, the total gas quantity does not rapidly increase at around 270° C. The same thing is true for the ion current indicating the water quantity, that is, the ion current does not rapidly increase at around 270° C. In other words, it is indicated that the internal gas and moisture of the organic passivation film 108 according to the present invention are already released during the processes.

According to the present invention, the intermediate film 109 formed with SiO, SiN or the like serves to further prevent the organic passivation film 108 from absorbing the moisture and the gas contained in the atmosphere again. It is, therefore, possible to further ensure the prevention of the film separation caused by the moisture and the gas contained in the organic passivation film.

Second Embodiment

Figure 8:
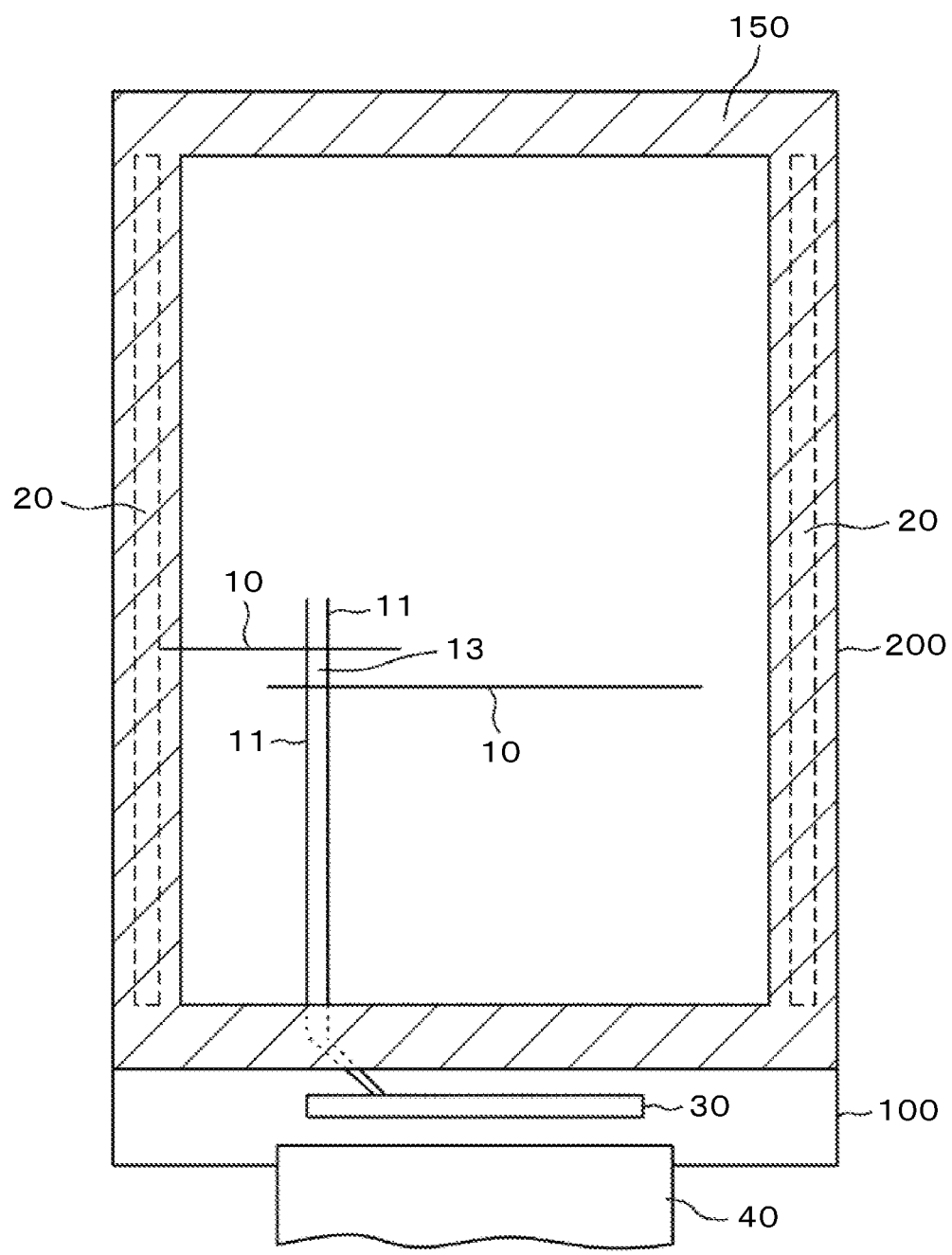
FIG. 8 is a plan view of a liquid crystal display device according to a second embodiment of the present invention.

A second embodiment is directed to a case where the present invention is applied to a liquid crystal display device. FIG. 8 is a plan view of the liquid crystal display device. In FIG. 8, the TFT substrate 100 and a counter substrate 200 are adhesively bounded to each other by a seal member 150 on peripheral parts, and a liquid crystal is sealed inside. A part inside of the seal member 150 serves as a display region.

A portion where only the TFT substrate 100 is present serves as a terminal part, in which the driver IC 30 is mounted and the flexible wiring board 40 is connected to the terminal part. In FIG. 8, the scan line drive circuits 20 are formed on the two sides of the display region. The scan lines 10 extend alternately from the left and right scan line drive circuits 20 in the lateral direction. The video signal lines 11 extend from the driver IC 30 in the longitudinal direction. A region surrounded by the two scan lines 10 and the two video signal lines 11 serves as a pixel 13.

Figure 9:
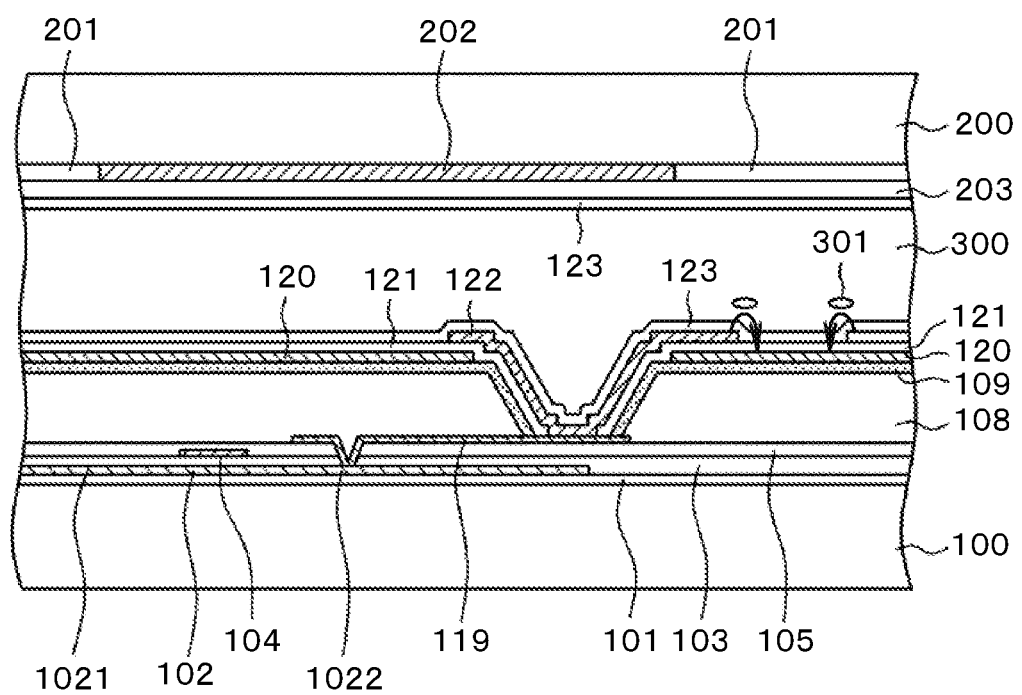
FIG. 9 is a cross-sectional view of the liquid crystal display device according to the second embodiment.

FIG. 9 is a cross-sectional view of a pixel part of the liquid crystal display device according to the present invention. In FIG. 9, the base film 101 is formed on the TFT substrate 100 formed with glass. The base film 101 is the same as that described in relation to the organic EL display device according to the first embodiment. The semiconductor layer 102 is formed on the base film 101.

The gate insulation film 103 is formed to cover the semiconductor layer 102, and the gate electrode 104 is formed on the gate insulation film 103. Each of the scan lines 10 serve as the gate electrode 104. After the gate electrode 104 is formed, ion implantation is carried out to impart conductivity to the portions of the semiconductor layer 102 that are not covered with the gate electrode 104, thereby forming the drain 1021 and the source 1022.

The interlayer insulation film 105 is formed with SiN or the like by the CVD to cover the semiconductor layer 102. A contact electrode 119 is formed on the interlayer insulation film 105. The contact electrode 119 connects a pixel electrode 122 to the source 1022 of each TFT via a through-hole formed in the interlayer insulation film 105 and a through-hole formed in the gate insulation film 103.

The organic passivation film 108 is formed with polyimide or the like to cover the interlayer insulation film 105, the contact electrode 119, and the like. Since the material constituting the organic passivation film 108 is the photo-sensitive resin, the organic passivation film 108 can be patterned to form the through-hole therein without using a resist. After the organic passivation film 108 is patterned and cured, the organic passivation film 108 is annealed at 300° C. for about one hour to release moisture and gas contained the organic passivation film 108.

Furthermore, similarly to the first embodiment, after the moisture and the gas are released from the organic passivation film 108, the intermediate film 109 is formed with SiO or SiN to prevent the organic passivation film 108 from absorbing moisture and the like from within the atmosphere again. A method of annealing the organic passivation film 108 and a method of forming the intermediate film 109 with SiO or SiN are the same as those described with reference to FIGS. 4 and 5.

Subsequently, the through-hole is formed in the intermediate film 109 within the through-hole of the organic passivation film 108, thereby making it possible to connect the contact electrode 118 to the pixel electrode 112. A common electrode 120 formed with ITO is then formed into a planar shape on the intermediate film 109. A capacitive insulation film 121 is then formed with SiN, and the pixel electrode 122 is formed with ITO into either a comb-like shape or a stripe shape on the capacitive insulation film 121. The pixel electrode 122 is connected to the contact electrode 118 via a through-hole formed in the capacitive insulation film 121 within the through-hole of the organic passivation film 108, and is connected to the source 1022 of the TFT.

Subsequently, an alignment layer 123 for aligning liquid crystal molecules 301 in an initial orientation is formed to cover the pixel electrode 122 and the capacitive insulation film 121. In FIG. 9, when a voltage is applied to the pixel electrode 122, then electric lines of force are generated between the pixel electrode 122 and the common electrode 120 as indicated by arrows to rotate the liquid crystal molecules 301 and to control a transmittance of a liquid crystal layer 300, and an image is formed.

In FIG. 9, the counter substrate 200 formed with glass is disposed to face the TFI substrate 100 across the liquid crystal layer 300. Color filters 201 and a black matrix 202 are formed inside of the counter substrate 200, and an overcoat film 203 is formed to cover these films. The alignment layer 123 is formed to cover the overcoat film 203.

In the present invention, after being cured, the organic passivation film 108 is further subjected to annealing at 250° C. to 300° C. for one hour or longer. Therefore, it is possible to effectively release the moisture, the gas, and the like from the organic passivation film 108. Moreover, the intermediate film 109 is formed to cover the organic passivation film 108. Therefore, even if the TIF substrate 100 is left uncontrolled for long time after formation of the organic passivation film 108, it is possible to prevent moisture and the like from flowing into the organic passivation film 108 again.

Figure 10:
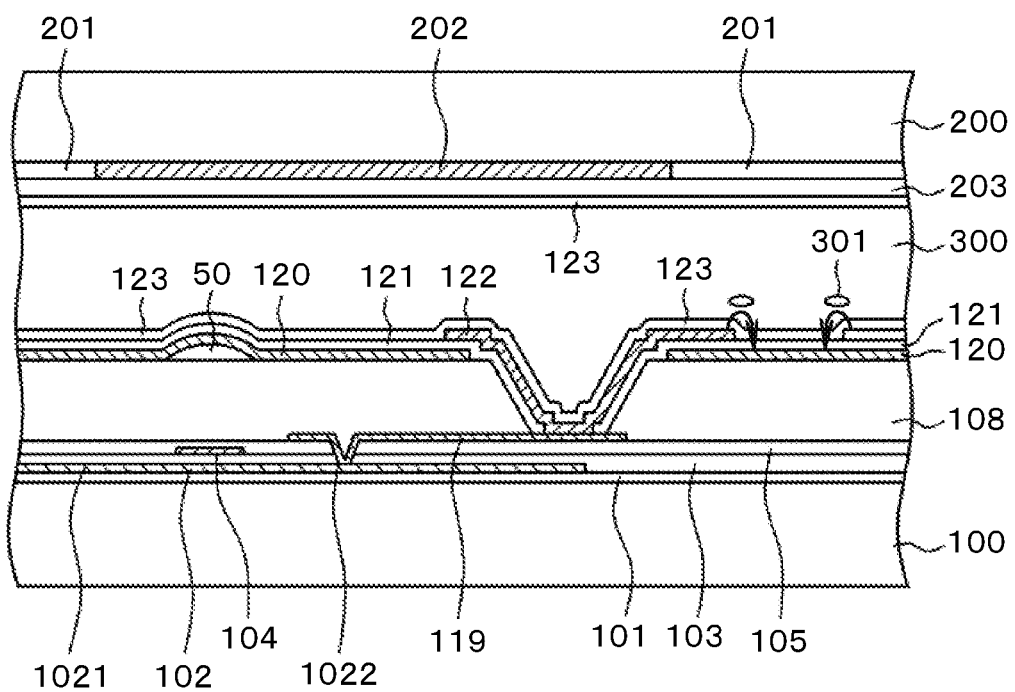
FIG. 10 is a cross-sectional view of a liquid crystal display device for illustrating problems in a case where the present invention is not applied.

FIG. 10 is a cross-sectional view of a liquid crystal display device in a case where the present invention is not applied. FIG. 10 is the same as FIG. 9 except that the intermediate film 109 covering the organic passivation film 108 is not present. However, in the case where the present invention is not applied, the moisture and gas in large quantities are contained in the organic passivation film 108, so that the moisture and the gas are released from the organic passivation film 108 while the liquid crystal display device is operating. As shown in FIG. 10, the air bubbles 50 are then often generated between the organic passivation film 108 and the common electrode 120 or between the organic passivation film 108 and the capacitive insulation film 121. The generated air bubbles 50 have a serious influence on the operation of the liquid crystal display device.

According to the present invention, by contrast, the moisture and the gas can be sufficiently released from the organic passivation film 108, and the intermediate film 109 can prevent the organic passivation film 108 from absorbing moisture and the gas from within the atmosphere again. It is, therefore, possible to realize the liquid crystal display device with high reliability.

FIG. 9 illustrates a configuration such that the common electrode 120 is formed on the intermediate film 109 formed to cover the organic passivation film 108, and the pixel electrode 122 is formed on the common electrode 120 via the capacitive insulation film 121. However, the present invention is also applicable to a configuration such that the pixel electrode 122 is formed on the intermediate film 109 and the common electrode 120 is formed on the pixel electrode 122 via the capacitive insulation film 121, as opposed to the former configuration.

While it has been described in the first and second embodiments that the intermediate film 109 is formed with SiO or SiN, the intermediate film 109 may be a stacked film composed of an SiO film and an SiN film. The stacked film can be continuously formed by the CVD in the film formation chamber 503 shown in FIG. 5. In this case, a total film thickness of the stacked film is, for example, 50 to 200 nm.

While the TFT of a top gate structure has been described in the first and second embodiments, the present invention is similarly applicable to a TFT of a bottom gate structure. In a case of the TFT of the bottom gate structure, a semiconductor layer formed with a-Si is frequently used. Moreover, while it has been described in the first and second embodiments that the Si-based semiconductor is used for the TFT, the present invention is not limited thereto. The present invention is also applicable to a TFT using an oxide semiconductor such as IGZO.

What is claimed is:

1. A method of manufacturing an organic EL display device including a TFT formed on a substrate and an organic passivation film formed to cover the TFT, the method comprising:
   coating a polyimide material;
   curing the polyimide material to form the organic passivation film;
   forming a first through hole in the organic passivation film;
   annealing the organic passivation film at 250° C. to 300° C. for one hour or longer after forming the organic passivation film;
   preheating the organic passivation film in a CVD device at a first temperature after the annealing;
   heating the organic passivation film in the CVD device at a second temperature, the second temperature is higher than the first temperature;
   depositing an intermediate film formed with SiO or SiN to directly cover and be in contact with the organic passivation film and an inner wall of the first through hole, in an environment at 200° C. to 300° C. by CVD after the heating in the CVD device, wherein the preheating the organic passivation film, the heating the organic passivation film, and the depositing the intermediate film are formed in the CVD device continuously without breaking vacuum environment;
   forming a first electrode on the intermediate film;
   forming a bank on the first electrode;
   forming a second through hole in the bank to overlap the first electrode;
   forming an organic EL film on the first electrode in the second through hole of the bank, and
   forming a second electrode on the organic EL film.

2. The method of manufacturing an organic EL display device according to claim 1, wherein the preheating and the heating are conducted in different chambers of the CVD device.

3. The method of manufacturing an organic EL display device according to claim 1, wherein the preheating, the heating, and the depositing the intermediate film by the CVD are executed in different chambers within a same vacuum device.

* * * * *